United States Patent
Bang et al.

(10) Patent No.: US 11,367,766 B2
(45) Date of Patent: Jun. 21, 2022

(54) ORGANIC LIGHT EMITTING DIODE DISPLAY DEVICE AND METHOD OF MANUFACTURING ORGANIC LIGHT EMITTING DIODE DISPLAY DEVICE

(71) Applicant: Samsung Display Co., LTD., Yongin-si (KR)

(72) Inventors: Seokhwan Bang, Yongin-si (KR); Jong-In Kim, Seoul (KR); Kangnam Kim, Seoul (KR); Woogeun Lee, Yongin-si (KR); Sung-Hoon Lim, Suwon-si (KR); Soojung Chae, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 4 days.

(21) Appl. No.: 16/841,189

(22) Filed: Apr. 6, 2020

(65) Prior Publication Data
US 2020/0350383 A1 Nov. 5, 2020

(30) Foreign Application Priority Data
May 3, 2019 (KR) .......................... 10-2019-0052609

(51) Int. Cl.
| | |
|---|---|
| H01L 27/32 | (2006.01) |
| H01L 27/12 | (2006.01) |
| H01L 51/56 | (2006.01) |
| H01L 29/786 | (2006.01) |
| H01L 29/49 | (2006.01) |
| H01L 29/66 | (2006.01) |

(52) U.S. Cl.
CPC ...... *H01L 27/3262* (2013.01); *H01L 27/3246* (2013.01); *H01L 51/56* (2013.01); *H01L 2227/323* (2013.01); *H01L 2251/303* (2013.01)

(58) Field of Classification Search
CPC .................................................. H01L 27/3262
See application file for complete search history.

(56) References Cited

U.S. PATENT DOCUMENTS

| | | | |
|---|---|---|---|
| 10,192,957 B2 | 1/2019 | Baeck et al. | |
| 2016/0020266 A1* | 1/2016 | Park | H01L 27/1255 |
| | | | 438/23 |

(Continued)

FOREIGN PATENT DOCUMENTS

KR 10-2018-0124874 11/2018

*Primary Examiner* — Omar F Mojaddedi
(74) *Attorney, Agent, or Firm* — Kile Park Reed & Houtteman PLLC

(57) ABSTRACT

An organic light emitting diode display device includes a substrate, an active layer disposed on the substrate and including a metal oxide-based semiconductor, a gate electrode disposed on the active layer, an insulating layer disposed on the gate electrode, source and drain electrodes disposed on the insulating layer, a light emitting element on the source and drain electrodes, and a gate insulating layer between the active layer and the gate electrode. The gate insulating layer includes first and second gate insulating layers. The first gate insulating layer directly contacts the active layer and has a first amount of nitrogen. The second gate insulating layer is disposed on the first gate insulating layer and has a second amount of nitrogen that is different from the first amount of nitrogen.

7 Claims, 12 Drawing Sheets

(56) References Cited

U.S. PATENT DOCUMENTS

| | | | |
|---|---|---|---|
| 2016/0118244 A1* | 4/2016 | Hayashi | H01L 29/7869 |
| | | | 257/43 |
| 2016/0260744 A1* | 9/2016 | Jiang | H01L 27/1214 |
| 2018/0331230 A1* | 11/2018 | Kudo | H01L 29/78603 |
| 2019/0123142 A1* | 4/2019 | Baeck | H01L 29/78696 |

* cited by examiner

ORGANIC LIGHT EMITTING DIODE DISPLAY DEVICE AND METHOD OF MANUFACTURING ORGANIC LIGHT EMITTING DIODE DISPLAY DEVICE

CROSS-REFERENCE TO RELATED APPLICATION

This application claims priority under 35 USC § 119 to Korean Patent Application No. 10-2019-0052609, filed on May 3, 2019 in the Korean Intellectual Property Office (KIPO), the entire disclosure of which is incorporated herein by reference.

BACKGROUND

1. Field

Embodiments relate generally to an organic light emitting diode display device and a method of manufacturing organic light emitting diode display device. More particularly, such embodiments relate to an organic light emitting diode display device including a metal oxide-based semiconductor element and a method of manufacturing the organic light emitting diode display device including a metal oxide-based semiconductor element.

2. Description of the Related Art

A flat panel display device may be used to replace a cathode ray tube display device because the flat panel display device may have light weight and thin features. A liquid crystal display device and an organic light emitting diode display device may be examples of the flat panel display device.

An organic light emitting diode display device including a metal oxide-based semiconductor element having a relatively short channel length has been developed. In a case that a channel length of an active layer decreases, the metal oxide-based semiconductor element may have a relatively small size. However, in a case that the channel region decreases, dispersion of a threshold voltage of the semiconductor element may increase, and photoelectric reliability and channel length scalability of the semiconductor element may decrease. To solve this, oxygen contained in an insulating layer that directly contacts the active layer may be provided to the channel region. In a case that the oxygen may be provided to the active layer, the dispersion of the threshold voltage of the semiconductor element may decrease. However, in a case that the insulating layer directly contacts the active layer, the oxygen may be excessively provided in the channel region, and thus a driven range of the semiconductor element may be shifted.

SUMMARY

Embodiments provide an organic light emitting diode display device including a metal oxide-based semiconductor element.

Embodiments provide a method of manufacturing an organic light emitting diode display device including the metal oxide-based semiconductor element.

According to an embodiment, an organic light emitting diode display device may include a substrate, an active layer, a gate electrode, an insulating layer, a source electrode and a drain electrode, a light emitting element, and a gate insulating layer. The active layer may be disposed on the substrate and may include a metal oxide-based semiconductor. The gate electrode may be disposed on the active layer. The insulating layer may be disposed on the gate electrode. The source and drain electrodes may be disposed on the insulating layer. The light emitting element may be disposed on the source and drain electrodes. The gate insulating layer may be disposed between the active layer and the gate electrode. The gate insulating layer may include a first gate insulating layer and a second gate insulating layer. The first gate insulating layer may directly contact the active layer and may include a first amount of nitrogen. The second gate insulating layer may be disposed on the first gate insulating layer and may include a second amount of nitrogen that is different from the first amount of nitrogen.

The second amount of nitrogen included in the second gate insulating layer may be greater than the first amount of nitrogen included in the first gate insulating layer, and the second amount of nitrogen included in the second gate insulating layer may be equal to or greater than about $5*10^{20}$ atoms/cm$^3$.

The gate insulating layer may include silicon oxide or metal oxide.

The gate insulating layer may include a material which is SiO, AlO, GaO, TiO, TaO, MnO, ZnO, ZrO, HfO, or LaO.

An amount of oxygen included in the second gate insulating layer may be higher than an amount of oxygen included in the first gate insulating layer.

The organic light emitting diode display device may further include a buffer layer between the substrate and the active layer.

An amount of nitrogen included in the buffer layer may be higher than the first amount of nitrogen included in the first gate insulating layer and lower than the second amount of nitrogen included in the second gate insulating layer.

A thickness of the first gate insulating layer may be less than a thickness of the second gate insulating layer.

According to an embodiment, a method of manufacturing an organic light emitting diode display device may be provided as follows. A substrate may be provided. An active layer including a metal oxide-based semiconductor may be formed on the substrate. A first gate insulating layer may be formed on the active layer at a first temperature and with a first plasma deposition power. A second gate insulating layer may be formed on the first gate insulating layer at the first temperature and with a second plasma deposition power. A heat treatment process may be performed on the active layer. A gate electrode may be formed on the second gate insulating layer. A source electrode and a drain electrode may be formed on the gate electrode. A light emitting element may be formed on the source electrode and the drain electrode.

The first plasma deposition power may be lower than the second plasma deposition power.

The forming of the first gate insulating layer may include forming a first silicon oxide layer via N$_2$O/SiH$_4$ gas to have a first thickness.

The forming of the second gate insulating layer may include forming a second silicon oxide layer via N$_2$O/SiH$_4$ gas to have a second thickness greater than the first thickness.

An amount of oxygen included in the second gate insulating layer may be higher than an amount of oxygen included in the first gate insulating layer.

The performing of the heat treatment process may cause an amount of excess oxygen contained in the second gate insulating layer to pass through the first gate insulating layer and be diffused into the active layer.

An amount of nitrogen included in the second gate insulating layer may be equal to or greater than about $5*10^{20}$ atoms/cm$^3$.

Each of the first and second gate insulating layers may include silicon oxide or metal oxide.

Each of the first and second gate insulating layers may include a material which is SiO, AlO, GaO, TiO, TaO, MnO, ZnO, ZrO, HfO, or LaO.

The method may further include forming a buffer layer on the substrate at a second temperature and with the first plasma deposition power.

The second temperature may be lower than the first temperature.

An amount of nitrogen included in the buffer layer may be higher than an amount of nitrogen included in the first gate insulating layer and lower than an amount of nitrogen included in the second gate insulating layer.

Since the organic light emitting diode display device herein may include the first gate insulating layer, the active layer may be prevented from being excessively supplied with oxygen. Accordingly, photoelectric reliability and channel length scalability of the semiconductor element may be improved, and a driven range of the semiconductor element may be prevented from being shifted.

Excess oxygen of the second gate insulating layer may pass through the first gate insulating layer, and the amount of the excess oxygen may be transferred to the active layer during the heat treatment process that may be performed to improve electron mobility of the active layer. Accordingly, the heat treatment process and the oxygen transfer process may be simultaneously performed on the active layer during a single processing stage provided by the heat treatment process. Accordingly, the manufacturing cost of the organic light emitting diode display device may be relatively reduced.

In a case that the oxygen may be supplied to the active layer, the photoelectric reliability and the channel length scalability of the semiconductor element may be ensured. Thus, even when the semiconductor element including the active layer having a relatively short channel region is small in size, the characteristics and functionality of the semiconductor element may be maintained.

BRIEF DESCRIPTION OF THE DRAWINGS

Embodiments herein may be understood in more detail from the following description taken in conjunction with the accompanying drawings, in which.

DETAILED DESCRIPTION OF THE EMBODIMENTS

Figure 1:
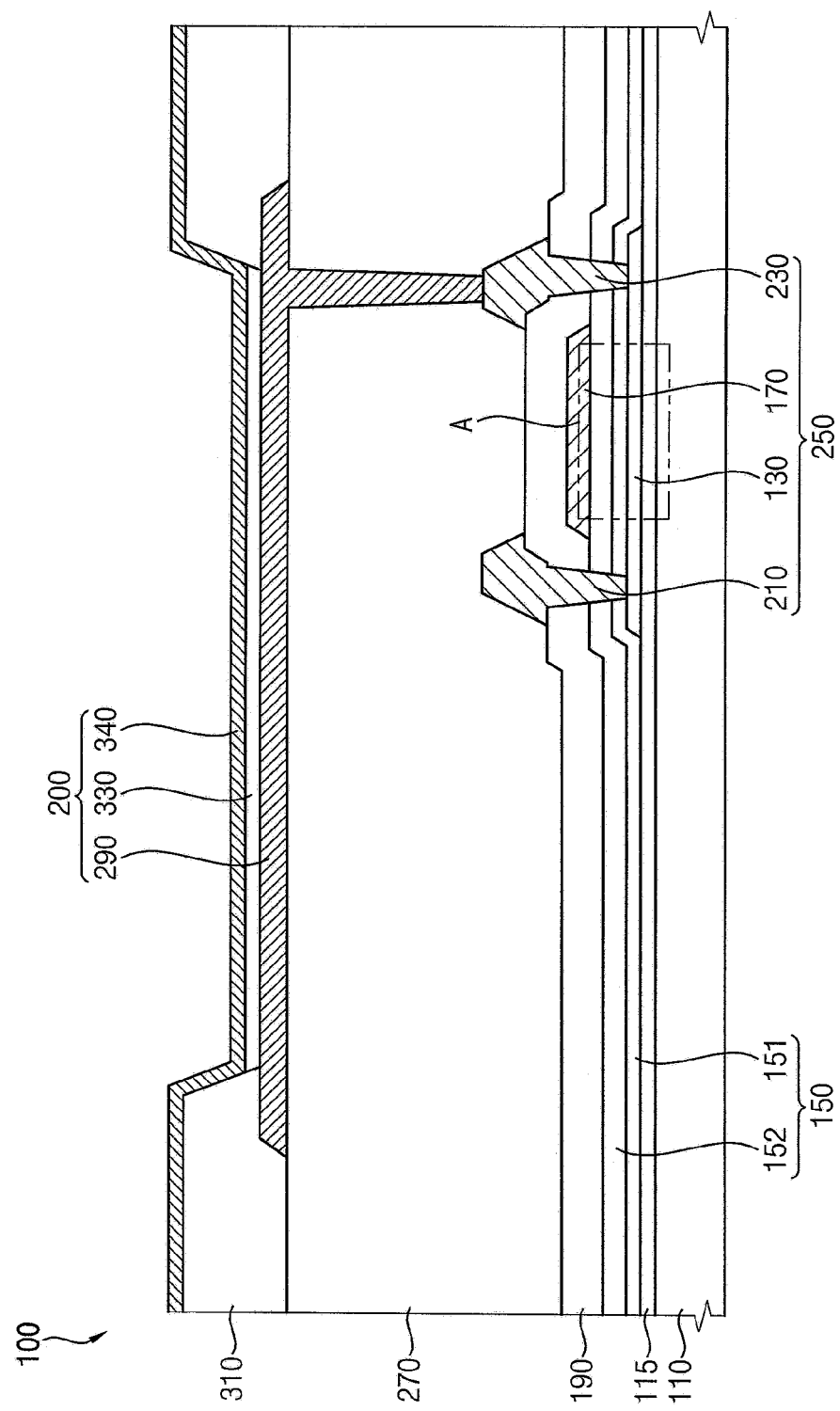
FIG. 1 shows a schematic cross-sectional view showing an organic light emitting diode display device.

Hereinafter, an organic light emitting diode display device and a method of manufacturing an organic light emitting diode display device according to embodiments of the disclosure will be described in detail with reference to the accompanying drawings.

Although aspects of the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure. Some of the parts which are not associated with the description may not be provided in order to describe various embodiments and like reference numerals refer to like elements throughout the specification.

Further, in the specification, the phrase "in a plan view" means when an object portion is viewed from above, and the phrase "in a schematic cross-sectional view" means when a cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first object may directly or indirectly oppose a second object. In a case in which a third object intervenes between the first and second object, the first and second objects may be understood as being indirectly opposed to one another, although still facing each other.

When a layer, region, substrate, or area, is referred to as being "on" another layer, region, substrate, or area, it may be directly on the other film, region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof. As used herein, the term "and/or" includes any and all combinations of one or more of the associated listed items.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, 80%, or 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
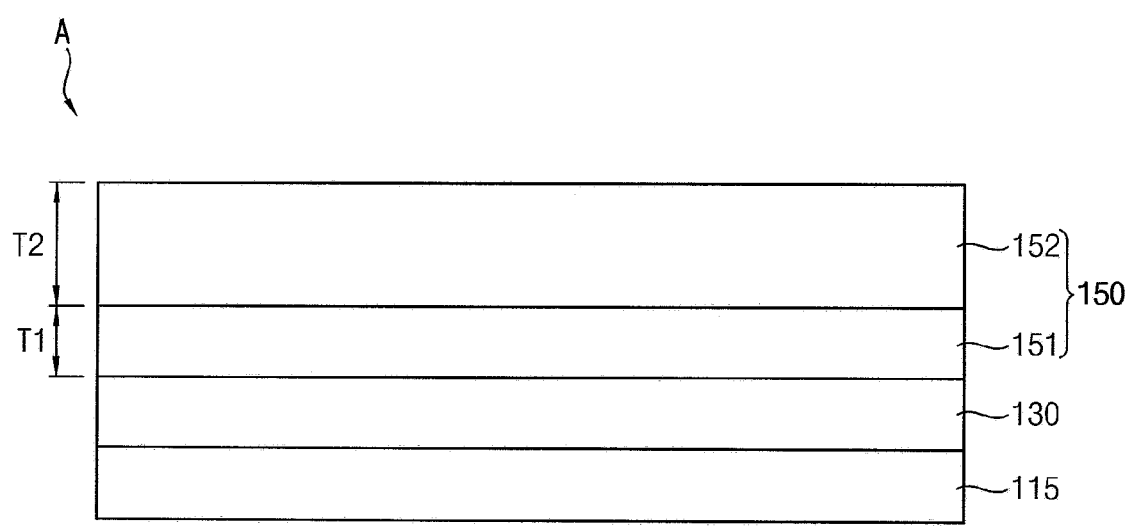
FIG. 2 shows a partially enlarged sectional view enlarging and showing the area 'A' of FIG. 1.

FIG. 1 shows a sectional view showing an organic light emitting diode display device according to embodiments of the disclosure. FIG. 2 shows a partially enlarged sectional view enlarging and showing the area 'A' of FIG. 1.

Referring to FIGS. 1 and 2, the organic light emitting diode display device 100 may include a substrate 110, a buffer layer 115, a semiconductor element 250, a gate insulating layer 150, an insulating layer 190, a planarization layer 270, and a light emitting element 200, a pixel defining layer 310, and the like. The semiconductor element 250 may include an active layer 130, a gate electrode 170, a source electrode 210, and a drain electrode 230, and the gate insulating layer 150 may include a first gate insulating layer 151 and a second gate insulating layer 152. The light emitting element 200 may include a lower electrode 290, a light emitting layer 330, and an upper electrode 340.

In a case that the organic light emitting diode display device 100 may include the gate insulating layer 150, the active layer 130 may be prevented from being excessively supplied with oxygen.

The substrate 110 may be provided. The substrate 110 may be formed of a transparent or opaque material. For example, the substrate 110 may include a quartz substrate, a synthetic quartz substrate, a calcium fluoride substrate, a fluorine-doped (F-doped) quartz substrate, a soda-lime glass substrate, a non-alkali glass substrate, and the like. Selectively, the substrate 110 may be formed of a transparent resin substrate having flexibility. An example of the transparent resin substrate that may be used for the substrate 110 may include a polyimide substrate. The polyimide substrate may be composed of a first polyimide layer, a barrier film layer, a second polyimide layer, and the like. For example, the polyimide substrate may be configured such that the first polyimide layer, the barrier film layer, and the second polyimide layer may be laminated on a hard glass substrate. In a method of manufacturing an organic light emitting diode display device including the polyimide substrate, once the insulating layer (such as the buffer layer 115) may be disposed on the second polyimide layer of the polyimide substrate, an upper structure (such as the semiconductor element 250, or the light emitting element 200) may be disposed on the insulating layer. Once the upper structure may be provided, the hard glass substrate may be removed. In other words, since the polyimide substrate may be thin and flexible, it may be difficult to directly provide the upper structure on the polyimide substrate. Considering the above difficulty, the upper structure may be formed using the hard glass substrate and the glass substrate may be removed, so that the polyimide substrate may be used as the substrate 110.

The buffer layer 115 may be disposed on the substrate 110. The buffer layer 115 may be disposed entirely on the substrate 110. The buffer layer 115 may prevent metal atoms or impurities from diffusing from the substrate 110 to the semiconductor element 250 and the light emitting element 200. In a case that a surface of the substrate 115 may not be uniform, the buffer layer 115 may serve to improve the flatness of the surface of the substrate 110. Depending on the type of substrate 110, at least two buffer layers 115 may be provided on the substrate 110, or the buffer layers 115 may not be disposed. For example, the buffer layer 115 may include silicon oxide or metal oxide. The buffer layer 115 may include silicon oxide, and an amount of nitrogen included in the buffer layer 115 may be about $3.1*10^{20}$ atoms/cm$^3$. In other embodiments, the buffer layer 115 may have a multi-layer insulating layer structure. The insulating layers thereof may have different thicknesses or include different materials.

The active layer 130 may be disposed on the buffer layer 115. The active layer 130 may include a metal oxide semiconductor. In other words, the active layer 130 may be an oxide semiconductor layer including a binary compound (ABx), a ternary compound (ABxCy), and a quarternary compound (ABxCyDz) that contain indium (In), zinc (Zn), gallium (Ga), tin (Sn), titanium (Ti), aluminum (Al), hafnium (Hf), zirconium (Zr), magnesium (Mg), and the like. For example, the active layer 130 may include zinc oxide (ZnO), gallium oxide (GaO), titanium oxide (TiO), tin oxide (SnO), indium oxide (InO), indium-gallium oxide (IGO), indium zinc oxide (IZO), indium-tin oxide (ITO), gallium-zinc oxide (GZO), zinc-magnesium oxide (ZMO), zinc-tin oxide (ZTO), zinc-zirconium oxide (ZnZrO), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and the like. The active layer 130 may be divided into a source region, a drain region, and a channel region positioned between the source region and the drain region. The active layer 130 may have a relatively short channel region. For example, a length of the channel region of the active layer 130 may be equal to or less than about 3 micrometers. An amount of nitrogen included in the active layer 130 may be about $1.0*10^{15}$ atoms/cm$^3$.

The first gate insulating layer 151 may be disposed on the substrate 110 and the active layer 130, and a bottom surface of the first gate insulating layer 151 may directly contact the active layer 130. As shown in FIG. 2, the first gate insulating layer 151 may have a first thickness T1. The first gate insulating layer 151 may cover the active layer 130, and may be disposed entirely on or over the substrate 110. For example, the first gate insulating layer 151 may cover the active layer 130, and be disposed to have the substantially same thickness along a profile of the active layer 130. As another example, the first gate insulating layer 151 may sufficiently cover the active layer 130 on the substrate 110, and may have a substantially planar top surface without generating a step around the active layer 130. The gate insulating layer 151 may include silicon compound oxide, metal oxide, and the like. For example, the first gate insulating layer 151 may include at least one of silicon oxide (SiO), silicon oxynitride (SiON), silicon oxycarbide (SiOC), aluminum oxide (AlO), gallium oxide (GaO), titanium oxide (TiO), tantalum oxide (TaO), manganese oxide (MnO), zinc oxide (ZnO), zirconium oxide (ZrO), hafnium oxide (HfO) and lanthanum oxide (LaO).

The first gate insulating layer 151 may include silicon oxide. According to a ratio of silicon and oxygen of the first gate insulating layer 151 resulting from the manufacturing process of the first gate insulating layer 151 described below, a proportion of the silicon may be relatively higher than that of the oxygen, compared with the second gate insulating layer 152. In other words, the first gate insulating layer 151 may have a relatively low amount of oxygen. The first gate insulating layer 151 may have a first amount of nitrogen. For example, the first amount of nitrogen may be about $2.2*10^{20}$ atoms/cm$^3$. The first gate insulating layer 151 may have a multi-layer insulating layer structure. The insulating layers may have different thicknesses or include different materials.

In a case that the thickness of the first gate insulating layer 151 may be relatively large, a large amount of hydrogen may be contained in the first gate insulating layer 151. In a case that the hydrogen may be transferred (i.e., diffused) to the active layer 130, the active layer 130 may become conductive. Accordingly, the first gate insulating layer 151 may have a predetermined thickness (for example, a first thickness T1 that may be smaller than a thickness of the second gate insulating layer 152). In other words, in a case that the first gate insulating layer 151 may have a relatively small thickness, when compared with the thickness of the second gate insulating layer 152, semiconductor characteristics and functionality of the active layer 130 may be ensured.

The second gate insulating layer 152 may be disposed on the first gate insulating layer 151, and a bottom surface of the second gate insulating layer 152 may directly contact the first gate insulating layer 151. As shown in FIG. 2, the second gate insulating layer 152 may have a second thickness T2 that is greater than Ti. The second gate insulating layer 152 may be disposed entirely on the first gate insulating layer 151. For example, the second gate insulating layer 152 may be disposed to have the substantially same thickness along a profile of the first gate insulating layer 151. As another example, the second gate insulating layer 152 may sufficiently cover the first gate insulating layer 151 on the first gate insulating layer 151, and may have a substantially planar top surface. The second gate insulating layer 152 may include silicon oxide, metal oxide, and the like. For example, the second gate insulating layer 152 may include at least one of silicon oxide, silicon oxynitride, silicon oxycarbide, aluminum oxide, gallium oxide, titanium oxide, tantalum oxide, manganese oxide, zinc oxide, zirconium oxide, hafnium oxide and lanthanum oxide.

The second gate insulating layer 152 may include silicon oxide. According to a ratio of silicon and oxygen of the second gate insulating layer 152 resulting from the manufacturing process of the second gate insulating layer 152 described below, a proportion of the oxygen may be relatively higher than that of the silicon, when compared with the first gate insulating layer 151. In other words, the second gate insulating layer 152 may have a relatively higher amount of oxygen (such as oxygen and excess oxygen as defined below). For example, in the method of manufacturing the organic light emitting diode display device 100, a part of the excess oxygen contained in the second gate insulating layer 152 may be transferred to the active layer 130 due to a heat treatment process that may be performed to improve the electron mobility of the active layer 130.

The second gate insulating layer 152 may have a second amount of nitrogen that is greater than that of the first amount of nitrogen of the first gate insulating layer 151. For example, the second amount of nitrogen may be about $5.9*10^{20}$ atoms/cm$^3$. The second gate insulating layer 152 may have a multi-layer insulating layer structure. The insulating layers may have different thicknesses or include different materials.

Accordingly, the gate insulating layer 150 including the first gate insulating layer 151 and the second gate insulating layer 152 may be disposed.

The first gate insulating layer 151 may adjust an amount of the excess oxygen diffused into the active layer 130 so that a predetermined amount of the excess oxygen may be supplied to the active layer 130 as the excess oxygen of the second gate insulating layer 152 is diffused into the active layer 130. In other words, the first thickness T1 of the first gate insulating layer 151 may be selectively determined to adjust, i.e., filter, the amount of the excess oxygen that may be diffused into the active layer 130. Accordingly, the excess oxygen of the second gate insulating layer 152 may pass through the first gate insulating layer 151, and a part of that excess oxygen may be transferred to the active layer 130 during the heat treatment process performed to improve electron mobility of the active layer 130, so that photoelectric reliability and channel length scalability of the semiconductor element may be increased. In other words, the characteristics and functionality of the semiconductor element 250 may be maintained even when the size of the semiconductor element 250, including the active layer 130 having a relatively short channel region, decreases. Simultaneously, the aforementioned part of the excess oxygen of the second gate insulating layer 152 may supplied to the active layer 130 by the first gate insulating layer 151 in a selectively predetermined amount according to the thickness T1 of the first gate insulating layer 151, so that a driven range of the semiconductor element 250 may be prevented from being shifted.

Contrastingly and according to the conventional organic light emitting diode display device, a gate insulating layer for supplying oxygen to the active layer may be directly disposed on the active layer. However, in a case that the gate insulating layer directly contacts the active layer 130, the oxygen may be excessively provided in the channel region of the active layer 130, and thus a driven range of the semiconductor element may be shifted, and a defect of the semiconductor element may result.

Referring back to FIG. 1, the gate electrode 170 may be disposed on the gate insulating layer 150, including the second gate insulating layer 152. The gate electrode 170 may be disposed on a portion of the gate insulating layer 150 and the active layer 130. In other words, the gate electrode 170 may overlap or face the channel region of the active layer 130. The gate electrode 170 may include a metal, a metal alloy, metal nitride, conductive metal oxide, a transparent conductive material, and the like. For example, the gate electrode 170 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy containing aluminum, aluminum nitride (AlN), an alloy containing silver, tungsten nitride (WN), an alloy containing copper, an alloy containing molybdenum, titanium nitride (TiN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), and the like. These may be used alone or in combination with each other. The gate electrode 170 may have a multi-layer structure.

The insulating layer 190 may be disposed on the gate insulating layer 150 and the gate electrode 170. The insulating layer 190 may cover the gate electrode 170, and may be disposed entirely on the gate insulating layer 150. For example, the insulating layer 190 may cover the gate electrode 170, and may be disposed to have the substantially same thickness along a profile of the gate electrode 170. As another example, the insulating layer 190 may sufficiently cover the gate electrode 170 on the gate insulating layer 150, and may have a substantially planar top surface without generating a step around the gate electrode 170. The insulating layer 190 may include silicon compound, metal oxide, or the like. For example, the insulating layer 190 may include silicon oxide (SiO), silicon nitride (SiN), silicon oxynitride (SiON), silicon oxycarbide (SiOC), silicon carbonitride (SiCN), silicon oxycarbide (SiOC), aluminum oxide (AlO), aluminum nitride (AlN), tantalum oxide (TaO), hafnium oxide (HfO), zirconium oxide (ZrO), titanium oxide (TiO), and the like. The insulating layer 190 may have a multi-layer insulating layer structure. The insulating layers may have different thicknesses or include different materials.

The source electrode 210 and the drain electrode 230 may be disposed on the insulating layer 190. The source electrode 210 may be connected to the source region of the active layer 130 through a first contact hole formed by removing first portions of the insulating layer 190 and the gate insulating layer 150. The drain electrode 230 may be connected to the drain region of the active layer 130 through a second contact hole formed by removing second portions of the insulating layer 190 and the gate insulating layer 150.

Each of the source electrode 210 and the drain electrode 230 may include a metal, an alloy, metal nitride, conductive metal oxide, a transparent conductive material, or the like. These may be used alone or in combination with each other. Each of the source electrode 210 and the drain electrode 230 may have a multi-layer structure.

Accordingly, the semiconductor element 250 including the active layer 130, the gate electrode 170, the source electrode 210, and the drain electrode 230 may be disposed. The semiconductor element 250 may function as a transistor having an upper gate.

Although the organic light emitting diode display device 100 has been described as including one transistor (such as the semiconductor element 250), the configuration may not be limited thereto. For example, the organic light emitting diode display device 100 may be configured to include at least two transistors and at least one capacitor. In a case that the organic light emitting diode display device 100 includes at least two transistors, all the transistors may be formed of a metal oxide-based semiconductor element. Some of the transistors may be formed of the metal oxide-based semiconductor element and the rest of the transistors may be formed of a silicon-based semiconductor element.

Further, although the semiconductor element 250 has been described as having an upper gate, the configuration may not be limited thereto. For example, the semiconductor element 250 may have a bottom gate or a double gate.

The planarization layer 270 may be disposed on the insulating layer 190, the source electrode 210, and the drain electrode 230. The planarization layer 270 may be disposed entirely on the insulating layer 190. For example, the planarization layer 270 may be disposed to have a relatively thick thickness to sufficiently cover the source electrode 210 and the drain electrode 230. The planarization layer 270 may have a substantially planar top surface, and a planarization process may be implemented to the planarization layer 270 to provide the planar top surface of the planarization layer 270. A part of the top surface of the drain electrode 230 may be exposed through the contact hole formed by removing a part of the planarization layer 270. The planarization layer 270 may include an organic material or an inorganic material. The planarization layer 270 may include an organic material. For example, the planarization layer 270 may include photoresist, polyacryl-based resin, polyimide-based resin, polyamide-based resin, siloxane-based resin, acryl-based resin, epoxy-based resin, and the like.

The lower electrode 290 may be disposed on the planarization layer 270. The lower electrode 290 may be connected to the drain electrode 230 after passing through the contact hole of the planarization layer 270. The lower electrode 290 may be electrically connected to the semiconductor element 250. The lower electrode 290 may include a metal, an alloy, metal nitride, conductive metal oxide, a transparent conductive material, or the like. These may be used alone or in combination with each other. The lower electrode 290 may have a multi-layer structure.

The pixel defining layer 310 may be disposed on the planarization layer 270 and a portion of the lower electrode 290. The pixel defining layer 310 may cover both sides of the lower electrode 290, and may expose a part of the top surface of the lower electrode 290. The pixel defining layer 310 may be formed of an organic material or an inorganic material. The pixel defining layer 310 may include an organic material.

The light emitting layer 330 may be disposed on the lower electrode 290. The light emitting layer 330 may be formed using at least one of light emitting materials capable of emitting color lights (such as red light, green light, and blue light) that are different according to sub-pixels. The light emitting layer 330 may be formed by laminating light emitting materials capable of generating different color lights such as red light, green light and blue light, such that white light may be entirely emitted. A color filter may be disposed on the light emitting layer 330 (for example, the color filter may overlap or face the light emitting layer 330 on a bottom surface of an encapsulation substrate). The color filter may include at least one of a red color filter, a green color filter, and a blue color filter. Selectively, the color filter also may include a yellow color filter, a cyan color filter, and a magenta color filter. The color filter may include a photosensitive resin, a color photoresist, and the like.

The upper electrode 340 may be disposed on the pixel defining layer 310 and the light emitting layer 330. The upper electrode 340 may cover the light emitting layer 330 and the pixel defining layer 310, and may be disposed entirely on the light emitting layer 330 and the pixel defining layer 310. The upper electrode 340 may include a metal, an alloy, metal nitride, conductive metal oxide, a transparent conductive material, or the like. These may be used alone or in combination with each other. The upper electrode 340 may have a multi-layer structure.

Accordingly, the light emitting element 200 including the lower electrode 290, the light emitting layer 330, and the upper electrode 340 may be disposed.

The encapsulation substrate (not shown) may be disposed on the upper electrode 340. The encapsulation substrate may be formed of substantially the same material as the substrate 110. For example, the encapsulation substrate may include a quartz substrate, a synthetic quartz substrate, a calcium fluoride substrate, a fluorine-doped (F-doped) quartz substrate, a soda-lime glass substrate, a non-alkali glass substrate, and the like. The encapsulation substrate may be formed of a transparent inorganic material or a flexible plastic. For example, the encapsulation substrate may include a transparent resin substrate having flexibility. At least one inorganic layer and at least one organic layer may be alternately laminated to improve the flexibility of the organic light emitting diode display device 100. The laminated structure may include a first inorganic layer, an organic layer, and a second inorganic layer. For example, the first inorganic layer may be flexible and may be disposed along a profile of the upper electrode 340, the organic layer may be flexible and may be disposed on the first inorganic layer, and the second inorganic layer may be flexible and may be disposed on the organic layer. In other words, the laminated structure may correspond to a thin film encapsulation layer or member directly contacting the upper electrode 340. Accordingly, the organic light emitting diode display device 100 shown in FIG. 1 may be provided.

In a case that the organic light emitting diode display device 100 may include the first gate insulating layer 151, the active layer 130 may be prevented from being excessively supplied with oxygen. Accordingly, photoelectric reliability and channel length scalability of the semiconductor element 250 may be improved, and a driven range of the semiconductor element 250 may be prevented from being shifted.

Figure 3:
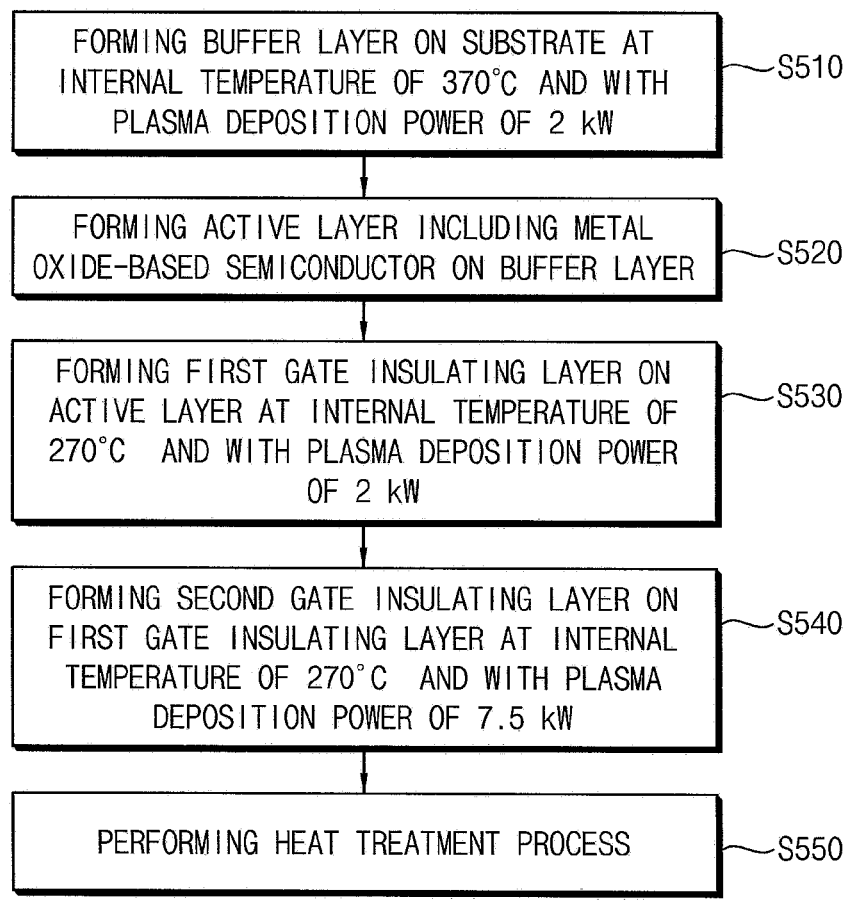
FIG. 3 shows a process flowchart showing a plasma deposition process and a heat treatment process of the organic light emitting diode display device of FIG. 1.
Figure 4A:
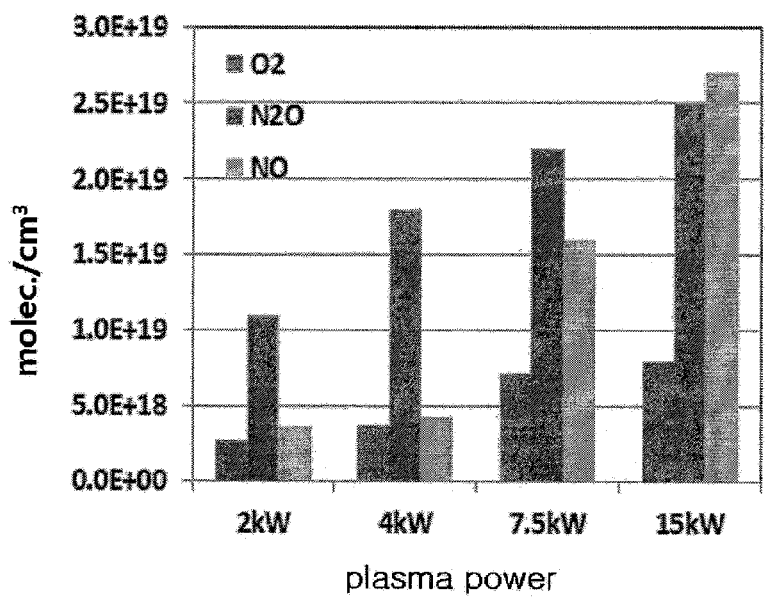
FIG. 4A shows a graph for describing an emitted amount of oxygen-related gas according to plasma deposition power of FIG. 3.
Figure 4B:
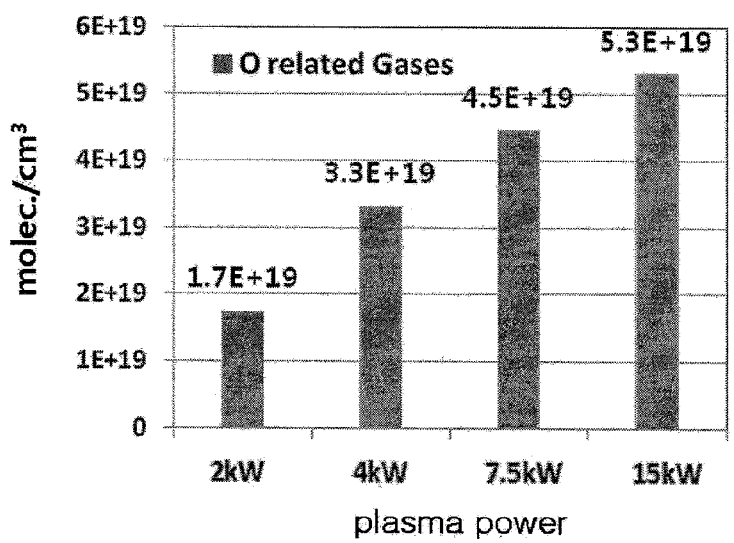
FIG. 4B shows a graph for describing an emitted amount of oxygen from a silicon oxide layer according to the plasma deposition power of FIG. 3.

FIG. 3 shows a process flowchart showing a plasma deposition process and a heat treatment process of the organic light emitting diode display device of FIG. 1. FIG. 4A shows a graph for describing an emitted amount of oxygen-related gas according to a plasma deposition power of FIG. 3. FIG. 4B shows a graph for describing an emitted amount of oxygen from a silicon oxide layer according to the plasma deposition power of FIG. 3.

Referring to FIG. 3, in the method of manufacturing the organic light emitting diode display device 100, the buffer layer 115, the first gate insulating layer 151, and the second gate insulating layer 152 may be formed of silicon oxide, and may be manufactured by processes that may be different from each other.

The substrate 110 may be provided in a chamber, and the buffer layer 115 may be formed on the substrate 110 through a plasma enhanced chemical vapor deposition (PECVD). For example, the buffer layer 115 may be formed on the substrate 110 at a high temperature (for example, a temperature between about 300° C. to about 400° C.) and with a weak plasma deposition power (for example, about 2 kW) by using $N_2O$ and $SiH_4$ gas in the chamber (S510). An amount of $N_2O$ of the gas may be equal to or greater than about 60 times that of $SiH_4$. In other words, a proportion of oxygen in the gas may be relatively greater than that of the silicon.

Once the buffer layer 115 may be formed, the active layer 130 may be formed on the buffer layer 115 (S520). The active layer 130 may be formed using indium-gallium-zinc oxide.

Once the active layer 130 may be formed, the first gate insulating layer 151 may be formed on the buffer layer 115 and the active layer 130 through the plasma enhanced chemical vapor deposition process (PECVD). For example, the first gate insulating layer 151 may be formed on the buffer layer 115 at a low temperature (for example, a temperature between about 200° C. to about 290° C.) and with a weak plasma deposition power (for example, about 2 kW) by using the $N_2O$ and $SiH_4$ gas in the chamber (S530). An amount of $N_2O$ of the gas may be equal to or greater than about 60 times that of $SiH_4$. In other words, a proportion of oxygen in the gas may be relatively greater than that of the silicon.

Once the first gate insulating layer 151 may be formed, the second gate insulating layer 152 may be formed on the first gate insulating layer 151 through the plasma enhanced chemical vapor deposition process (PECVD). For example, the second gate insulating layer 152 may be formed on the first gate insulating layer 151 at a low temperature (for example, a temperature between about 200° C. to about 290° C.) and with a strong plasma deposition power (for example, a deposition power equal to or greater than about 7.5 kW) by using the $N_2O$ and $SiH_4$ gas in the chamber (S540). An amount of $N_2O$ of the gas may be equal to or greater than about 60 times that of $SiH_4$. In other words, a proportion of oxygen in the gas may be relatively greater than that of the silicon.

For example, FIG. 4A shows an emitted amount of oxygen-related gas when heat may be applied to the gas according to the plasma deposition power (such as about 2 kW, or about 4 kW, or about 7.5 kW, or about 15 kW). As shown in FIG. 4A, a thermal desorption spectroscopy (TDS) analysis shows that the emitted amount of oxygen-related gas in the chamber increases in a case that the plasma deposition power increases. FIG. 4B shows an emitted amount of oxygen in a case that heat may be applied to the silicon oxide layer formed according to the plasma deposition power (such as about 2 kW, or about 4 kW, or about 7.5 kW, or about 15 kW). As shown in FIG. 4B, the TDS analysis shows that the amount of oxygen emitted from the silicon oxide layer may increase in a case that the plasma deposition power may increase. Accordingly, an amount of oxygen of the second gate insulating layer 152 formed with the strong plasma deposition power may be higher than an amount of oxygen of the first gate insulating layer 151 formed with the weak plasma deposition power. In other words, the second gate insulating layer 152 may contain oxygen and excess oxygen. The excess oxygen contained in the second gate insulating layer 152 may be generated by adjusting the plasma deposition power and the ratio of $N_2O$ and $SiH_4$ gas, and an oxygen atom having a weak bond with an oxygen atom connected to a silicon atom contained in the second gate insulating layer 152 may be defined as the excess oxygen.

In a case that a high plasma deposition power (such as about 7.5 kW or about 15 kW) may be implemented, nitrogen radicals (N radicals) may be generated from the $N_2O$ gas in the chamber.

Referring back to FIG. 3, the heat treatment process may be performed once the second gate insulating layer 152 may be formed (S550). Atoms contained in the active layer 130 may be rearranged through the heat treatment process, and electron mobility in the channel region of the active layer 130 may increase. The heat treatment process may be performed so that a part of the excess oxygen contained in the second gate insulating layer 152 may pass through the first gate insulating layer 151 and be transferred (i.e., diffused) to the active layer 130.

Figure 5:
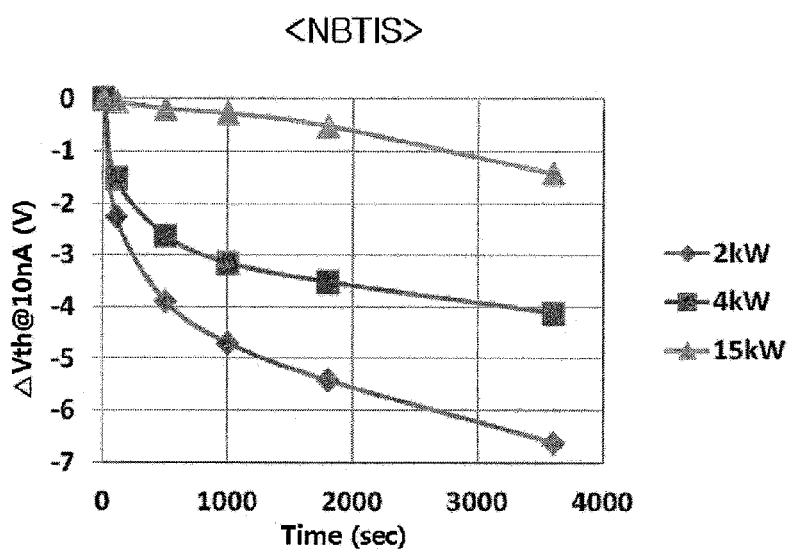
FIG. 5 shows a graph for describing a negative bias illumination temperature stress (NBTIS) of the semiconductor element of FIG. 3.

FIG. 5 shows a graph for describing a negative bias illumination temperature stress (NBTIS) of the semiconductor element of FIG. 3. For example, FIG. 5 shows an NBTIS of a semiconductor element according to silicon oxide insulating layers formed according to the plasma deposition power (such as about 2 kW, or about 4 kW, or about 15 kW). NBTIS conditions are Vgs=20 V; Vds=0 V and 60° C.; and 1000 nit and 3600 seconds of a white light source.

As shown in FIG. 5, it may be confirmed that a semiconductor element including a silicon oxide insulating layer formed with relatively high plasma deposition power (such as about 15 kW) may have a relatively reduced threshold voltage dispersion.

Figure 6:
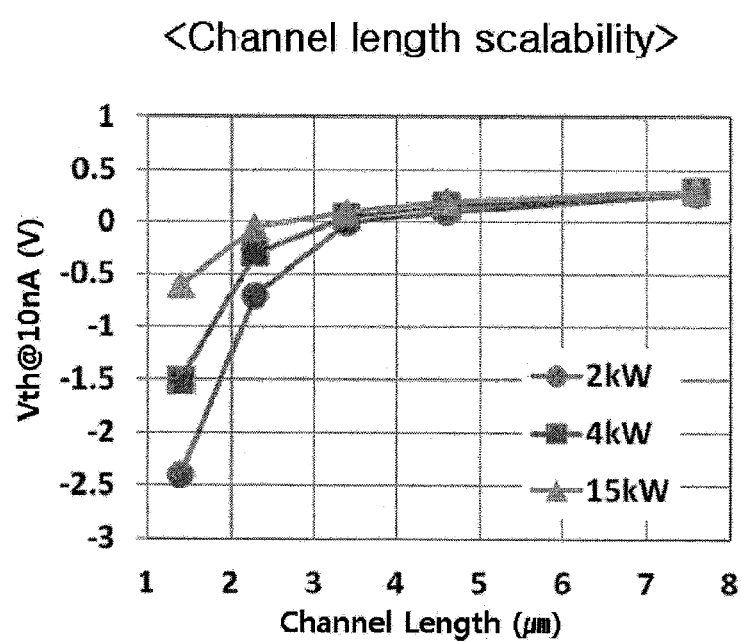
FIG. 6 shows a graph for describing the channel length scalability of the semiconductor element of FIG. 3.

FIG. 6 shows a graph for describing the channel length scalability of the semiconductor element of FIG. 3. For example, FIG. 6 shows a channel length scalability of the semiconductor element according to the silicon oxide insulating layers formed according to the plasma deposition power (such as about 2 kW, or about 4 kW, or about 15 kW).

As shown in FIG. 6, it may be confirmed that a semiconductor element including a silicon oxide insulating layer formed with relatively high plasma deposition power (such as about 15 kW) may have a relatively reduced threshold voltage dispersion.

Accordingly, in a case that the oxygen may be supplied to the active layer 130, the photoelectric reliability and the channel length scalability of the semiconductor element 250 may be ensured.

Figure 7:
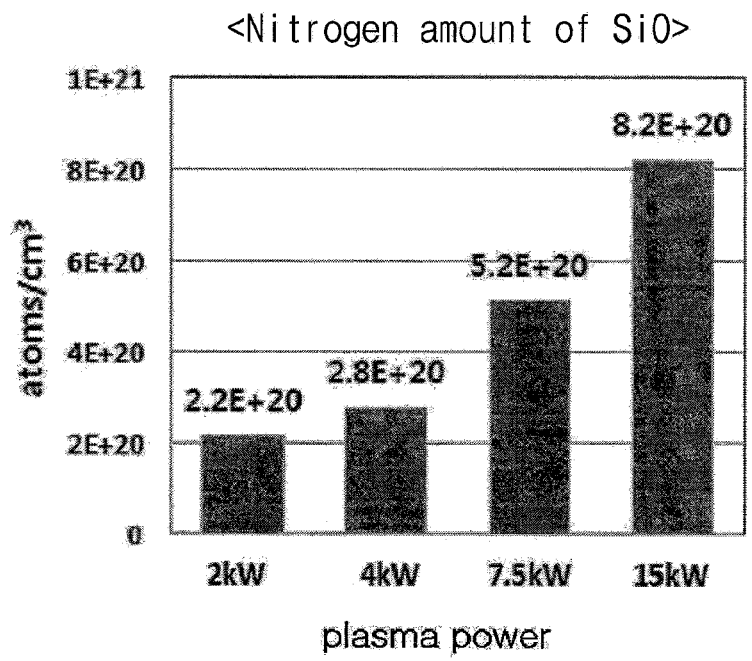
FIG. 7 shows a graph for describing an amount of nitrogen contained in the silicon oxide layer according to the plasma deposition power of FIG. 3.

FIG. 7 shows a graph for describing an amount of nitrogen contained in the silicon oxide layer according to the plasma deposition power of FIG. 3. For example, FIG. 7 shows an amount of nitrogen contained in the silicon oxide insulating layer formed according to the plasma deposition power (such as about 2 kW, or about 4 kW, or about 7.5 kW, or about 15 kW).

As shown in FIG. 7, as a result of a secondary ion mass spectroscopy (SIMS) measurement, it may be confirmed that a relatively large amount of nitrogen may be measured in the silicon oxide insulating layer formed with a relatively high plasma deposition power (such as about 15 kW). As mentioned with reference to FIG. 4, the nitrogen radicals may be generated in the chamber due to the strong plasma deposition power, and the amount of nitrogen of the second gate insulating layer 152 manufactured with the strong plasma deposition power (such as about 7.5 kW or about 15 kW) may increase after the nitrogen radicals combine with atoms contained in the second gate insulating layer 152.

Figure 8:
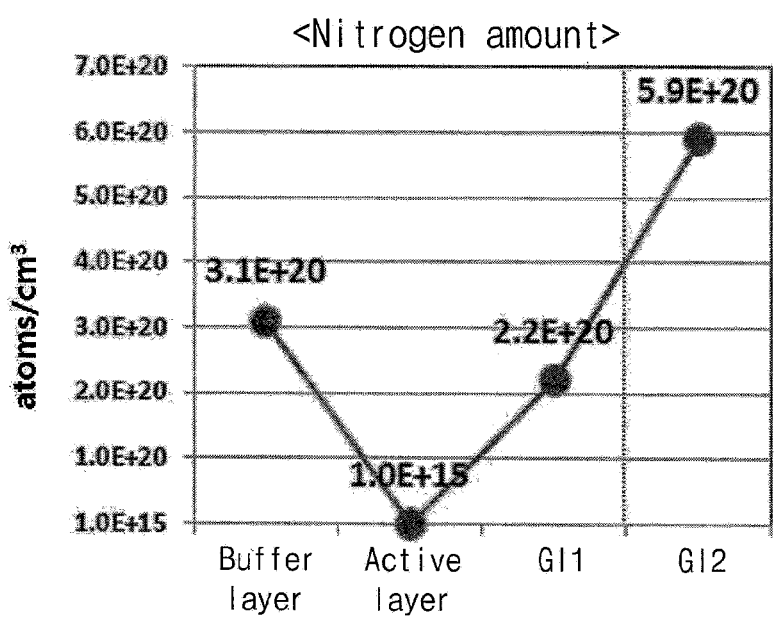
FIG. 8 shows a graph for describing amounts of nitrogen contained in the buffer layer, the active layer, the first gate insulating layer, and the second gate insulating layer of FIG. 3, respectively.

FIG. 8 shows a graph for describing amounts of nitrogen contained in the buffer layer, the active layer, the first gate insulating layer, and the second gate insulating layer of FIG. 3, respectively. For example, FIG. 8 shows amounts of nitrogen that may be contained in the buffer layer 115, the active layer 130, the first gate insulating layer 151 (such as GI1), and the second gate insulating layer 152 (such as GI2) included in the organic light emitting diode display device 100 of FIG. 3.

As shown in FIG. 8, it may be confirmed that the largest amount of nitrogen may be measured in the second gate insulating layer 152. For example, the smallest amount of nitrogen may be measured in the first gate insulating layer 151, and an amount of nitrogen may be measured in the buffer layer 115 to be more than the amount of nitrogen in first gate insulating layer 151.

FIGS. 9 to 14 show schematic sectional views showing the method of manufacturing the organic light emitting diode display device according to embodiments herein.

Figure 9:
FIGS. 9 to 14 show schematic cross-sectional views showing the method of manufacturing the organic light emitting diode display device.

Referring to FIG. 9, the substrate 110 may be provided in the chamber. The substrate 110 may include a transparent or opaque material. For example, the substrate 110 may be formed using a quartz substrate, a synthetic quartz substrate, a calcium fluoride substrate, a fluorine-doped quartz substrate, a soda-lime glass substrate, a non-alkali glass substrate, or the like. Selectively, the substrate 110 may be formed of a transparent resin substrate having flexibility. An example of the transparent resin substrate that may be used for the substrate 110 may include a polyimide substrate.

The buffer layer 115 may be formed on the substrate 110 through the plasma enhanced chemical vapor deposition (PECVD). For example, the buffer layer 115 may be formed on the substrate 110 at an internal temperature of about 370° C. and with plasma deposition power of about 2 kW by using the $N_2O$ and $SiH_4$ gas in the chamber. An amount of $N_2O$ of the gas may be equal to or greater than about 60 times that of $SiH_4$. In other words, a proportion of oxygen in the gas may be relatively greater than that of silicon. The buffer layer 115 may prevent metal atoms or impurities from being diffused from the substrate 110. In a case that the surface of the substrate 110 may not be uniform, the buffer layer 115 may serve to improve the flatness of the surface of the substrate 110. The buffer layer 115 may be formed of silicon oxide. The buffer layer 115 may be formed using a metal-organic chemical vapor deposition (MOCVD), an atomic layer deposition (ALD), a plasma enhanced atomic layer deposition (PEALD), a spin coating deposition (SCD), a sputtering process, or the like.

Figure 10:
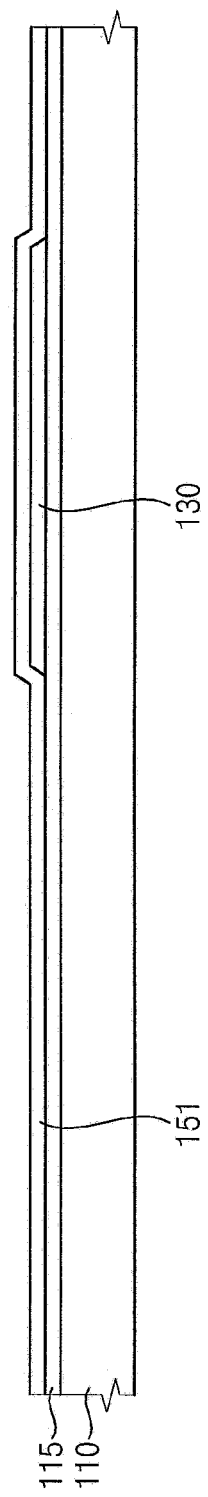

Referring to FIG. 10, once the buffer layer 115 may be formed, the active layer 130 may be formed on the buffer layer 115. The active layer 130 may be formed using a metal oxide semiconductor such as indium-gallium-zinc oxide. The active layer 130 may be divided into a source region, a drain region, and a channel region positioned between the source region and the drain region. The channel region of the active layer 130 may be relatively short. For example, the channel region may have a length equal to or less than about 3 micrometers.

Once the active layer 130 may be formed, the first gate insulating layer 151 may be formed on the buffer layer 115 through the plasma enhanced chemical vapor deposition process (PECVD). For example, the first gate insulating layer 151 may be formed on the buffer layer 115 at an internal temperature of about 270° C. and with a plasma deposition power of about 2 kW by using the N$_2$O and SiH$_4$ gas in the chamber. An amount of N$_2$O of the gas may be equal to or greater than about 60 times that of SiH$_4$. In other words, a proportion of oxygen in the gas may be relatively greater than that of the silicon.

A bottom surface of the first gate insulating layer 151 may directly contact the active layer 130, and the first gate insulating layer 151 may have a first thickness T1. The first gate insulating layer 151 may cover the active layer 130, and may be formed entirely on or over the substrate 110. For example, the first gate insulating layer 151 may cover the active layer 130, and be formed to have the substantially same thickness along a profile of the active layer 130. The first gate insulating layer 151 may sufficiently cover the active layer 130 on the substrate 110, and may have a substantially planar top surface without generating a step around the active layer 130.

The first gate insulating layer 151 may be formed using silicon oxide, metal oxide, or the like. For example, the first gate insulating layer 151 may include one selected from SiO, SiON, SiOC, AlO, GaO, TiO, TaO, MnO, ZnO, ZrO, HfO, and LaO, the first gate insulating layer 151 may be formed of silicon oxide. In terms of the ratio between silicon and oxygen of the silicon oxide, a portion of the silicon may be relatively higher than a portion of the oxygen. In other words, the first gate insulating layer 151 may have a relatively low amount of oxygen. The first gate insulating layer 151 may be formed using a metal-organic chemical vapor deposition (MOCVD), an atomic layer deposition (ALD), a plasma enhanced atomic layer deposition (PEALD), a spin coating deposition (SCD), a sputtering process, or the like.

Figure 11:
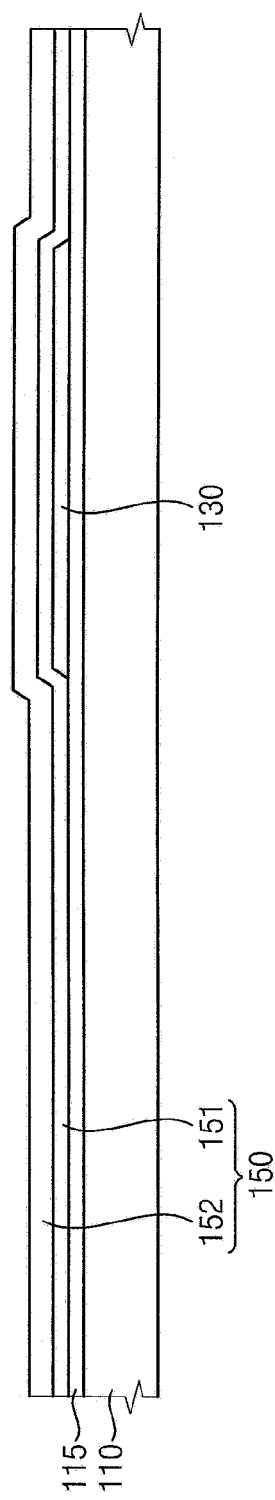

Referring to FIG. 11, once the first gate insulating layer 151 may be formed, the second gate insulating layer 152 may be formed on the first gate insulating layer 151 through the plasma enhanced chemical vapor deposition process (PECVD). For example, the second gate insulating layer 152 may be formed on the first gate insulating layer 151 at a temperature of about 270° C. and with plasma deposition power of about 7.5 kW by using the N$_2$O and SiH$_4$ gas in the chamber. An amount of N$_2$O of the gas may be equal to or greater than about 60 times that of SiH$_4$. In other words, a proportion of oxygen in the gas may be relatively greater than that of silicon. In a case that the second gate insulating layer 152 may be formed with the plasma deposition power of about 7.5 kW, nitrogen radicals may be generated in the N$_2$O gas in the chamber.

A bottom surface of the second gate insulating layer 152 may directly contact the first gate insulating layer 151, and the second gate insulating layer 152 may have a second thickness T2 that is greater than a thickness T1 of the first gate insulating layer 151. The second gate insulating layer 152 may be formed to have the substantially same thickness along the profile of the first gate insulating layer 151. The second gate insulating layer 152 may sufficiently cover the first gate insulating layer 151 on the first gate insulating layer 151, and may have a substantially planar top surface.

The second gate insulating layer 152 may be formed using silicon oxide, metal oxide, or the like. For example, the second gate insulating layer 152 may include one selected from SiO, SiON, SiOC, AlO, GaO, TiO, TaO, MnO, ZnO, ZrO, HfO, and LaO. The second gate insulating layer 152 may be formed of silicon oxide, and in terms of the ratio between silicon and oxygen of the silicon oxide, a portion of the oxygen may be relatively higher than a portion of the silicon. In other words, the second gate insulating layer 152 may have a relatively higher amount of oxygen (such as oxygen and excess oxygen) than does the first insulating layer 151. For example, excess oxygen may be contained in the second gate insulating layer 152 that is formed with the plasma deposition power of about 7.5 kW, and excess oxygen may not be contained in the first gate insulating layer 151 formed with the plasma deposition power of about 2 kW. The second gate insulating layer 152 may be formed using a metal-organic chemical vapor deposition (MOCVD), an atomic layer deposition (ALD), a plasma enhanced atomic layer deposition (PEALD), a spin coating deposition (SCD), a sputtering process, or the like.

Accordingly, the gate insulating layer 150 including the first gate insulating layer 151 and the second gate insulating layer 152 may be formed.

Figure 12:
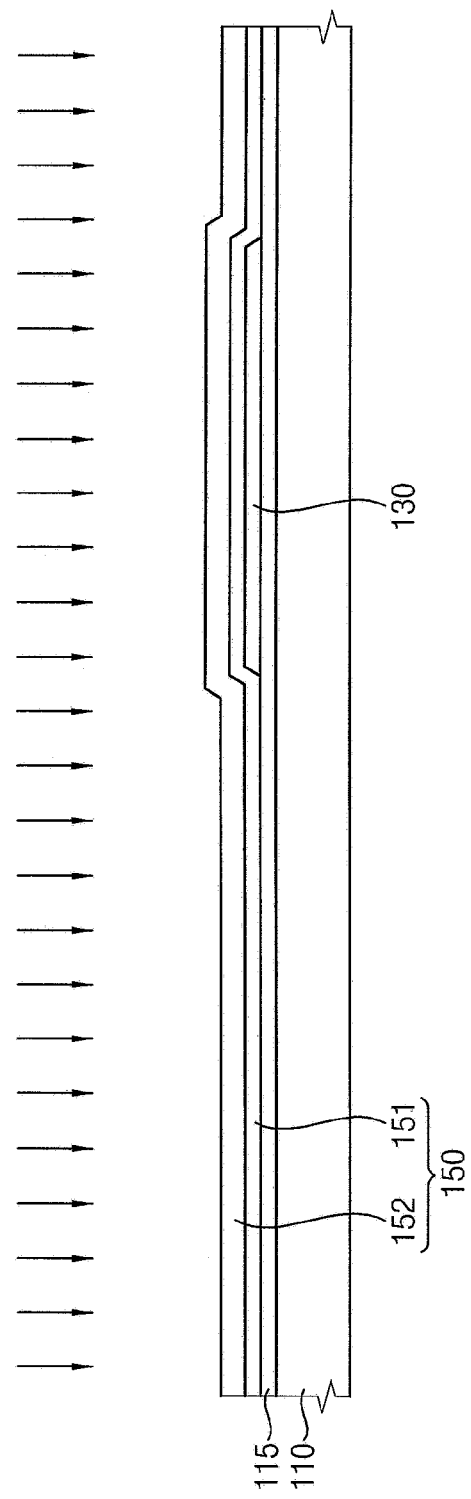

Referring to FIG. 12, once the second gate insulating layer 152 may be formed, the heat treatment process may be performed (as indicated by the downward arrows). Atoms contained in the active layer 130 may be rearranged because of the heat treatment process, and, as a result, the electron mobility in the channel region of the active layer 130 may increase. The heat treatment process may be performed to also cause a part of the excess oxygen contained in the second gate insulating layer 152 to pass through the first gate insulating layer 151 and be diffused into the active layer 130.

The first gate insulating layer 151 may adjust an amount of the excess oxygen diffused into the active layer 130 so that a predetermined amount of oxygen may be supplied to the active layer 130 as excess oxygen of the second gate insulating layer 152 may be diffused into the active layer 130. In other words, the first thickness T1 of the first gate insulating layer 151 may be selectively determined to adjust the amount of the excess oxygen that is to be diffused into the active layer 130. Accordingly, the excess oxygen of the second gate insulating layer 152 may pass through the first gate insulating layer 151, and a part of the excess oxygen may be transferred to the active layer 130 during the heat treatment process that is performed to improve electron mobility of the active layer 130 since the heat treatment process is implemented on the second insulating layer 152 that overlaps or faces the active layer 130. As a result, the heat treatment process and the oxygen transfer process may be simultaneously performed on the active layer 130 during a single processing stage provided by the heat treatment process.

Figure 13:
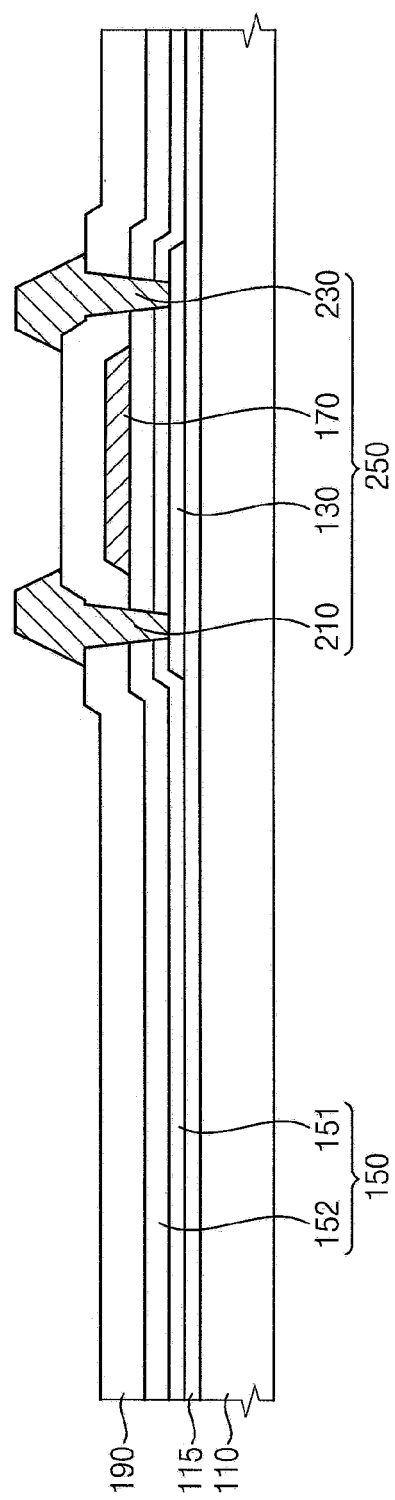

Referring to FIG. 13, the gate electrode 170 may be formed on the gate insulating layer 150, including the second gate insulating layer 152. The gate electrode 170 may be formed on a portion of the gate insulating layer 150. In other words, the gate electrode 170 may overlap or face the channel region of the active layer 130. The gate electrode 170 may be formed using a metal, a metal alloy, metal nitride, conductive metal oxide, a transparent conductive material, or the like. For example, the gate electrode 170 may include Au, Ag, Al, W, Cu, Pt, Ni, Ti, Pd, Mg, Ca, Li, Cr, Ta, Mo, Sc, Nd, Ir, an alloy containing aluminum, AN, an alloy containing silver, WN, an alloy containing copper, an alloy containing molybdenum, TiN, TaN, SrRuO, ZnO, ITO, SnO, InO, GaO, IZO, and the like. These may be used alone or in combination with each other. The gate electrode 170 may have a multi-layer structure.

The insulating layer 190 may be formed on the gate insulating layer 150 and the gate electrode 170. The insulating layer 190 may cover the gate electrode 170, and may be formed entirely on the gate insulating layer 150. For example, the insulating layer 190 may cover the gate electrode 170, and may be formed to have the substantially same thickness along a profile of the gate electrode 130. The insulating layer 190 may sufficiently cover the gate electrode 170, and may have a substantially planar top surface without generating a step around the gate electrode 170. The insulating layer 190 may be formed by using silicon compound, metal oxide, or the like. For example, the insulating layer 190 may include SiO, SiN, SiON, SiOC, SiCN, SiOC, AlO, AN, TaO, HfO, ZrO, TiO and the like. Selectively, the insulating layer 190 may have a multi-layer structure. The insulating layers may have different thicknesses or include different materials.

The source electrode 210 and the drain electrode 230 may be formed on the insulating layer 190. The source electrode 210 may be connected to the source region of the active layer 130 through a first contact hole formed by removing first portions of the insulating layer 190 and the gate insulating layer 150. The drain electrode 230 may be connected to the drain region of the active layer 130 through a second contact hole formed by removing second portions of the insulating layer 190 and the gate insulating layer 150. Each of the source electrode 210 and the drain electrode 230 may be formed by using a metal, an alloy, a metal nitride, a conductive metal oxide, a transparent conductive material, or the like. These may be used alone or in combination with each other. Each of the source electrode 210 and the drain electrode 230 may have a multi-layer structure.

Accordingly, the semiconductor element 250 including the active layer 130, the gate electrode 170, the source electrode 210, and the drain electrode 230 may be formed.

Figure 14:
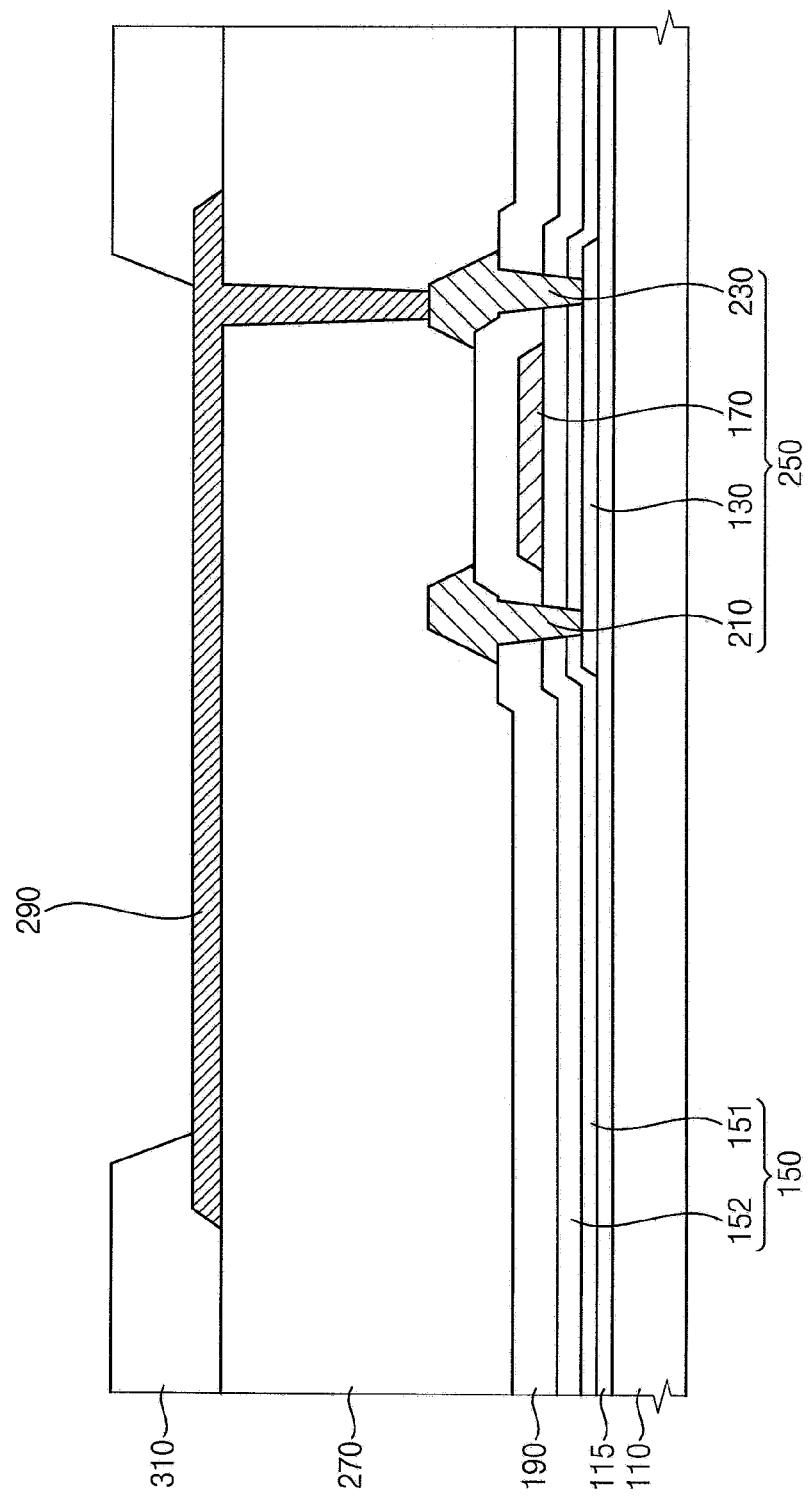

Referring to FIGS. 1 and 14, the planarization layer 270 may be formed entirely on the insulating layer 190, the source electrode 210, and the drain electrode 230. For example, the planarization layer 270 may be formed to have a relatively thick thickness to sufficiently cover the source electrode 210 and the drain electrode 230. The planarization layer 270 may have a substantially planar top surface, and a planarization process may be implemented to provide the planarized top surface of the planarization layer 270. A part of the top surface of the drain electrode 230 may be exposed through the contact hole formed by removing a part of the planarization layer 270. The planarization layer 270 may be formed using an organic material. For example, the planarization layer 270 may include photoresist, polyacryl-based resin, polyimide-based resin, polyamide-based resin, siloxane-based resin, acryl-based resin, epoxy-based resin, and the like.

The lower electrode 290 may be formed on the planarization layer 270. The lower electrode 290 may be connected to the drain electrode 230 after passing through the contact hole of the planarization layer 270. The lower electrode 290 may be electrically connected to the semiconductor element 250. The lower electrode 290 may be formed by using a metal, an alloy, a metal nitride, a conductive metal oxide, a transparent conductive material, or the like. These may be used alone or in combination with each other. The lower electrode 290 may have a multi-layer structure.

The pixel defining layer 310 may be formed on the planarization layer 270 and a portion of the lower electrode 290. The pixel defining layer 310 may cover both sides of the lower electrode 290, and may expose a part of the top surface of the lower electrode 290. The pixel defining layer 310 may be formed using an organic material.

The light emitting layer 330 may be formed on the lower electrode 290 exposed by the pixel defining layer 310. The light emitting layer 330 may be formed using at least one of light emitting materials capable of emitting color lights (such as red light, green light, and blue light) that are different according to sub-pixels. The light emitting layer 330 may be formed by laminating light emitting materials capable of generating different color lights such as red light, green light and blue light, such that white light may be entirely emitted. A color filter may be formed on the light emitting layer 330. The color filter may include at least one of a red color filter, a green color filter, and a blue color filter. Selectively, the color filter may include a yellow color filter, a cyan color filter, and a magenta color filter. The color filter may be formed using photosensitive resin, color photoresist, or the like.

The upper electrode 340 may be formed on the pixel defining layer 310 and the light emitting layer 330. The upper electrode 340 may cover the light emitting layer 330 and the pixel defining layer 310, and may be formed entirely on the light emitting layer 330 and the pixel defining layer 310. The upper electrode 340 may be formed by using a metal, an alloy, metal nitride, conductive metal oxide, a transparent conductive material, or the like. These may be used alone or in combination with each other. The upper electrode 340 may have a multi-layer structure.

Accordingly, the light emitting element 200 including the lower electrode 290, the light emitting layer 330, and the upper electrode 340 may be formed.

The encapsulation substrate (not shown) may be formed on the upper electrode 340. The encapsulation substrate may be formed of substantially the same material as the substrate 110. For example, the encapsulation substrate may include a quartz substrate, a synthetic quartz substrate, a calcium fluoride substrate, a fluorine-doped (F-doped) quartz substrate, a soda-lime glass substrate, a non-alkali glass substrate, and the like. In other exemplary embodiments, the encapsulation substrate may be formed of a transparent inorganic material or a flexible plastic. For example, the encapsulation substrate may include a transparent resin substrate having flexibility. At least one inorganic layer and at least one organic layer may be alternately laminated to improve the flexibility of the organic light emitting diode display device. The laminated structure may include a first inorganic layer, an organic layer, and a second inorganic layer. For example, the first inorganic layer may be flexible and may be formed along a profile of the upper electrode 340, the organic layer may be flexible and may be formed on the first inorganic layer, and the second inorganic layer may be flexible and may be formed on the organic layer. In other words, the laminated structure may correspond to a thin film encapsulation layer or member directly contacting the upper electrode 340. Accordingly, the organic light emitting diode display device 100 shown in FIG. 1 may be provided.

In the method of manufacturing the organic light emitting diode display device according to embodiments of the disclosure, the excess oxygen of the second gate insulating layer 152 may pass through the first gate insulating layer 151, and a part of the excess oxygen may be transferred to the active layer 130 as the heat treatment process is performed to improve electron mobility of the active layer 130 since the heat treatment process is implemented on the second insulating layer 152 that overlaps or faces the active layer 130. As a result, the heat treatment process and the oxygen transfer process may be simultaneously performed on the active layer 130 during a single processing stage provided by the heat treatment process. Accordingly, the manufacturing cost of the organic light emitting diode display device may be relatively reduced.

In a case that oxygen may be supplied to the active layer 130, the photoelectric reliability and the channel length scalability of the semiconductor element 250 may be ensured. Thus, even when the semiconductor element 250 including the active layer 130 having a relatively short channel region may be manufactured to be small in size, the characteristics and functionality of the semiconductor element 250 may be maintained since the oxygen may not be excessively supplied to the active layer 130.

Embodiments herein may be applied to various display devices including an organic light emitting diode display device. For example, the embodiments may be applied to, for example, a vehicle-display device, a ship-display device, an aircraft-display device, portable communication devices, display devices for information transfer, and a medical-display device, etc.

The foregoing is illustrative of the describe embodiments and is not to be construed as limiting thereof. Although a few embodiments have been described, those skilled in the art will readily appreciate that many modifications are possible without materially departing from the novel teachings and advantages which have been disclosed. Accordingly, all such modifications are intended to be included within the scope of the disclosed embodiments as defined in the claims.

What is claimed is:

1. An organic light emitting diode display device, comprising:
    a substrate;
    an active layer on the substrate and including a metal oxide-based semiconductor;
    a gate electrode on the active layer; an insulating layer on the gate electrode;
    a source electrode and a drain electrode each on the insulating layer;
    a light emitting element on the source electrode and the drain electrode; and
    a gate insulating layer between the active layer and the gate electrode, and including:
    a first gate insulating layer directly contacting the active layer, and having a first amount of nitrogen; and
    a second gate insulating layer on the first gate insulating layer and having a second amount of nitrogen that is different from the first amount of nitrogen,
    wherein a thickness of the first gate insulating layer is less than a thickness of the second gate insulating layer, and
    an amount of oxygen in the first gate insulating layer is different from an amount of oxygen in the second gate insulating layer.

2. The organic light emitting diode display device of claim 1, wherein
    the second amount of nitrogen included in the second gate insulating layer is greater than the first amount of nitrogen included in the first gate insulating layer, and
    the second amount of nitrogen included in the second gate insulating layer is equal to greater than about $5*10^{20}$ atoms/cm$^3$.

3. The organic light emitting diode display device of claim 1, wherein the gate insulating layer includes silicon oxide or metal oxide.

4. The organic light emitting diode display device of claim 3, wherein the gate insulating layer includes a material which is SiO, AlO, GaO, TiO, TaO, MnO, ZnO, ZrO, HfO, or LaO.

5. The organic light emitting diode display device of claim 3, wherein an amount of oxygen included in the second gate insulating layer is higher than an amount of oxygen included in the first gate insulating layer.

6. The organic light emitting diode display device of claim 1, further comprising a buffer layer between the substrate and the active layer.

7. The organic light emitting diode display device of claim 6, wherein an amount of nitrogen included in the buffer layer is higher than the first amount of nitrogen included in the first gate insulating layer and lower than the second amount of nitrogen included in the second gate insulating layer.

\* \* \* \* \*